(12) United States Patent
Graf

(10) Patent No.: US 10,985,744 B2
(45) Date of Patent: Apr. 20, 2021

(54) APPARATUS WITH INTEGRATED PROTECTION PROFILE AND METHOD

(71) Applicant: Infineon Technologies AG, Neubiberg (DE)

(72) Inventor: Alfons Graf, Kaufering (DE)

(73) Assignee: INFINEON TECHNOLOGIES AG, Neubiberg (DE)

(*) Notice: Subject to any disclaimer, the term of this patent is extended or adjusted under 35 U.S.C. 154(b) by 840 days.

(21) Appl. No.: 15/368,397

(22) Filed: Dec. 2, 2016

(65) Prior Publication Data
US 2017/0163255 A1 Jun. 8, 2017

(30) Foreign Application Priority Data

Dec. 4, 2015 (DE) .......................... 102015121194.7

(51) Int. Cl.
*H03K 17/082* (2006.01)
*H03K 17/08* (2006.01)

(52) U.S. Cl.
CPC . *H03K 17/0822* (2013.01); *H03K 2017/0806* (2013.01)

(58) Field of Classification Search
CPC .......... H02H 3/085; H02H 5/041; H02H 3/08; H03K 2017/0806; H03K 17/0822
See application file for complete search history.

(56) References Cited

U.S. PATENT DOCUMENTS

| | | | | |
|---|---|---|---|---|
| 5,898,557 A * | 4/1999 | Baba | ................... | H03K 17/0822 361/100 |
| 7,675,721 B2 * | 3/2010 | Elms | .................... | H01H 71/162 361/103 |
| 7,848,073 B2 * | 12/2010 | Takahashi | .......... | H03K 17/0822 361/93.1 |
| 7,869,178 B2 * | 1/2011 | Gayowsky | ............. | H02H 6/005 361/103 |
| 8,331,072 B1 * | 12/2012 | Liu | .......................... | H03F 1/52 361/93.7 |
| 8,730,635 B2 * | 5/2014 | Takahashi | .............. | H02H 3/087 361/93.8 |
| 8,760,889 B2 * | 6/2014 | Maruyama | ......... | H03K 17/0828 361/93.8 |
| 8,953,294 B2 * | 2/2015 | Graf | .................... | H03K 17/0822 361/111 |

(Continued)

FOREIGN PATENT DOCUMENTS

| | | |
|---|---|---|
| CN | 1921260 A | 2/2007 |
| CN | 102118014 A | 7/2011 |

(Continued)

OTHER PUBLICATIONS

Infineon Technologies AG, "Smart Highside High Current Power Switch," Data Sheet BTS50055-1TMC, Apr. 27, 2010, 17 pages.

*Primary Examiner* — Jared Fureman
*Assistant Examiner* — Christopher J Clark
(74) *Attorney, Agent, or Firm* — Slater Matsil, LLP

(57) ABSTRACT

An apparatus includes an electronic switch, a drive unit for driving the electronic switch, a diagnosis unit for determining a current through the electronic switch, a memory for storing a protection profile. The drive unit is configured such that the electronic switch is driven on the basis of the current through the electronic switch determined by the diagnosis unit and on the basis of the protection profile. Furthermore, a method is specified for driving an electronic switch.

30 Claims, 13 Drawing Sheets

(56) References Cited

U.S. PATENT DOCUMENTS

| | | | |
|---|---|---|---|
| 9,225,158 B2* | 12/2015 | Kawamoto | H02H 3/08 |
| 9,245,540 B1* | 1/2016 | Agness | G11B 5/5565 |
| 9,263,877 B1* | 2/2016 | Kellogg | H02H 3/085 |
| 10,003,260 B2* | 6/2018 | Rowald | H02M 3/156 |
| 2007/0103822 A1* | 5/2007 | Bilac | H02H 6/00 361/32 |
| 2008/0012666 A1* | 1/2008 | Davison | H02H 1/046 335/18 |
| 2008/0211566 A1* | 9/2008 | Graovac | B60R 21/017 327/419 |
| 2009/0168274 A1* | 7/2009 | Doppel | H02H 5/04 361/18 |
| 2010/0118461 A1* | 5/2010 | Ohshima | G05F 1/573 361/86 |
| 2011/0019325 A1* | 1/2011 | Nakamura | H02H 6/005 361/93.8 |
| 2014/0104892 A1* | 4/2014 | Lau | H03K 7/08 363/21.01 |
| 2015/0014687 A1* | 1/2015 | Nakajima | G01R 31/44 257/48 |
| 2015/0030051 A1* | 1/2015 | Cortigiani | H02H 3/07 374/137 |
| 2015/0130476 A1* | 5/2015 | Takahashi | H02M 1/32 324/537 |
| 2017/0012617 A1* | 1/2017 | Moctezuma | H02H 3/087 |
| 2017/0033783 A1* | 2/2017 | Rahman | H03K 17/0822 |
| 2017/0110871 A1* | 4/2017 | Foster | H02H 3/00 |
| 2017/0187319 A1* | 6/2017 | Ozawa | H02H 3/0935 |

FOREIGN PATENT DOCUMENTS

| | | |
|---|---|---|
| DE | 102007018761 A1 | 12/2007 |
| DE | 102013009781 A1 | 6/2014 |
| WO | 2008008446 A2 | 1/2008 |

\* cited by examiner

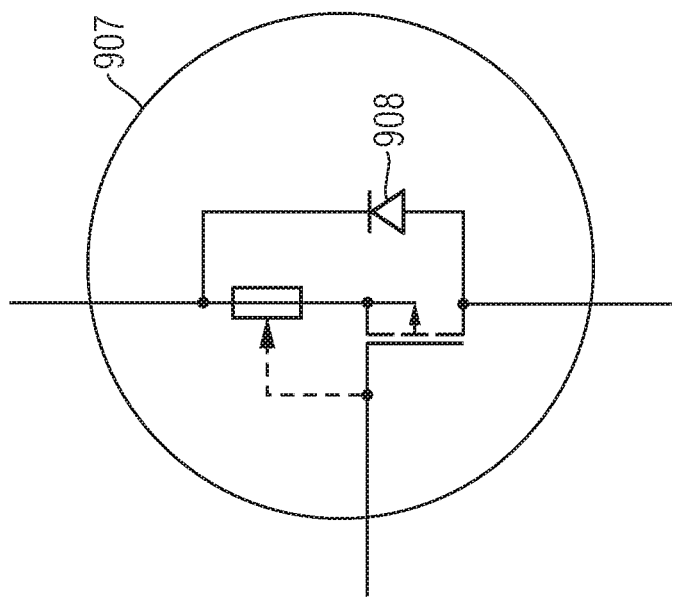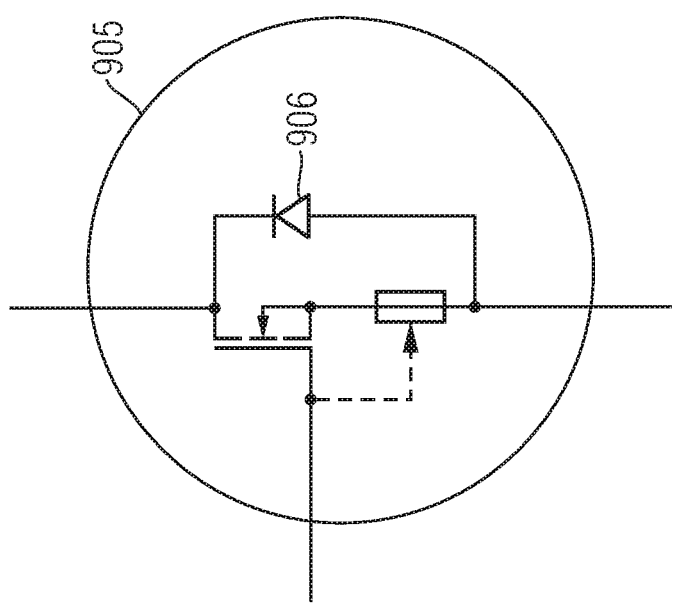
FIG 12

FIG 13
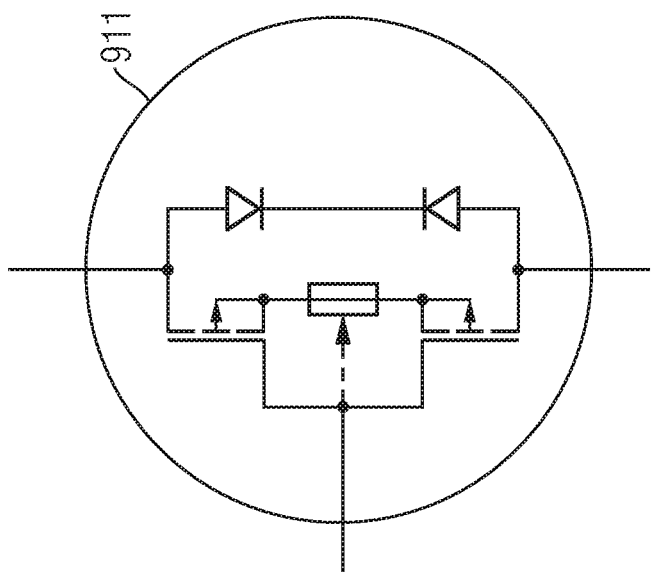
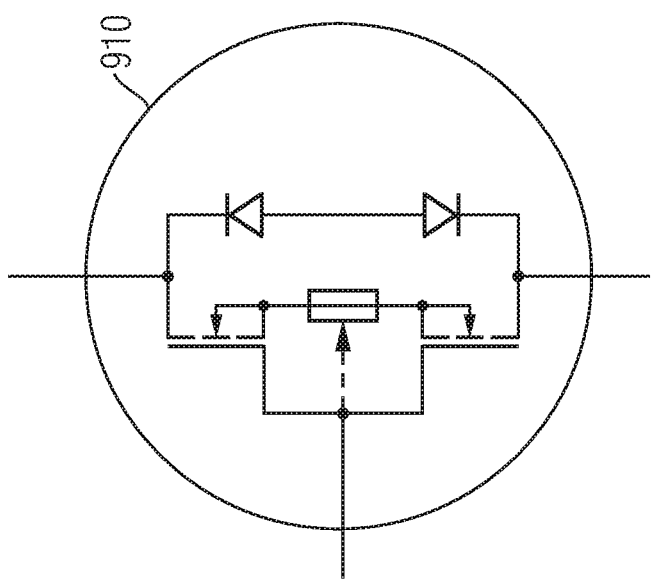

APPARATUS WITH INTEGRATED PROTECTION PROFILE AND METHOD

CROSS-REFERENCE TO RELATED APPLICATIONS

This application claims the priority of German patent application 10 2015 121 194.7, filed Dec. 4, 2015, which application is hereby incorporated herein by reference in its entirety.

TECHNICAL FIELD

The invention relates to an apparatus with an integrated protection profile (e.g. comprising at least one characteristic curve), and to a method for driving an electronic switch.

SUMMARY

The object of the invention is to improve an apparatus, in particular an electronic component, such that protection of the component and of possibly connected elements is improved.

This object is achieved in accordance with the features of the independent claims. Preferred embodiments can be gathered from the dependent claims, in particular.

In order to achieve the object an apparatus is specified, comprising
- an electronic switch,
- a drive unit for driving the electronic switch,
- a diagnosis unit for determining a current through the electronic switch,
- a memory for storing a protection profile,
- wherein the drive unit is configured such that the electronic switch is driven on the basis of the current through the electronic switch determined by the diagnosis unit and on the basis of the protection profile.

In this case, it is advantageous that the apparatus has an efficient built-in electrical fuse. A further advantage is that the apparatus has a self-protecting fuse function, without a separate microcontroller or some other external device being required. By way of example, the apparatus is a protective switch which protects itself and a connected line or load against an excessively high current. By way of example, the self-protection of the switch can be predefined by the suitable dimensioning of the electronic switch and the design of the protection profile.

The diagnosis unit and the memory can be an integrated part of the apparatus. In particular, an individual chip can be used for this purpose. It is also possible for a plurality of chips to be used for the integration of the apparatus.

In one option, the apparatus is mounted as chip-on-chip or as chip-by-chip. The switch and the protection apparatus can also be embodied monolithically in one chip.

The apparatus can be driven like a conventional transistor or MOSFET. In this respect, the driving of the base terminal or of the gate terminal can be carried out via a known gate driver.

In one option, the gate driver is integrated in the protection circuit and the driving is effected via a digital input pin.

In one option, the diagnosis unit determines the current through the electronic switch on the basis of a voltage measurement, e.g. a voltage drop across a drain-source path of a MOSFET or a collector-emitter path of a transistor.

Alternatively, the voltage measurement is possible at an arbitrary resistance portion in the main current path of the electronic switch. By way of example, it is possible to determine a voltage drop at a resistance of a bonding wire or at a resistance of a source metallization.

The fuse function provided by the apparatus is resettable e.g. via a voltage or voltage change which is applied to one of its terminals (e.g. the gate or input terminal or input pin).

The drive unit mentioned here can be embodied in particular as a processor unit and/or an at least partly hardwired or logical circuit arrangement which is configured for example in such a way that the method as described herein can be carried out. Said processing unit can be or comprise any type of processor or computer with correspondingly required peripherals (memory, input/output interfaces, input/output devices, etc.).

A line protection characteristic curve (also designated as fuse characteristic curve) is thus implemented, for example. Such a characteristic curve comprises, in particular, an (e.g. optimized) characteristic curve oriented toward the energetic protection and/or the thermal protection of the line and/or an (e.g. optimized) characteristic curve oriented toward the energetic and/or thermal protection of the electronic switch. These two characteristic curves can complement one another in terms of their function or they can already be covered by the respective other characteristic curve.

In one development, the diagnosis unit is configured for determining a temperature.

In one development, the temperature is determined by means of a temperature sensor arranged in proximity to the electronic switch.

The temperature sensor can be e.g. a pn junction or a temperature-sensitive resistor.

In one development, the drive unit is configured such that the electronic switch is driven on the basis of the current through the electronic switch determined by the diagnosis unit, on the basis of the temperature and on the basis of the protection profile.

In particular, a turn-off criterion for turning off the electronic switch can be determined by the current $IL(T)$ through the electronic switch, which results from the voltage $UDS(T)$ across the electronic switch and the resistance $RON(T)$ as a function of the temperature T:

$$IL(T)=UDS(T)/RON(T).$$

Alternatively, it is also possible to evaluate a voltage $UBHL(T)$ across a resistance, e.g. a bonding wire resistance $RB(T)$, as a function of the temperature T in accordance with:

$$IL(T)=UBHL(T)/RB(T).$$

An aim of this evaluation is to ensure the uniform current measurement at any temperature.

The fuse function presented here can be embodied as temperature-dependent or temperature-independent.

In one development, the temperature of the electronic switch is determined taking account of a thermal model of the switch.

In one development, the temperature of the line to be protected is determined taking account of a thermal model of the line.

Consequently, it is possible to determine for example the (actual) temperature of the electronic switch and/or the temperature of the line to be protected (e.g. by determining the temperature of the insulation material surrounding the line).

In one development, the protection profile corresponds to a characteristic curve or comprises at least one characteristic curve.

By way of example, the characteristic curve can be a fuse characteristic curve. Consequently, the electronic switch can be switched off if a current is determined which reaches or exceeds the fuse characteristic curve depending on the exposure time.

In one option, moreover, the characteristic curve is an $IL^2t$ characteristic curve or a modified function thereof.

In one development, the characteristic curve comprises a temperature-dependent profile of the resistance RON of the electronic switch.

In one development, the characteristic curve comprises a temperature-dependent profile of a resistance of a bonding wire.

In one development, the drive unit is configured such that it turns off the electronic switch on the basis of the current through the electronic switch determined by the diagnosis unit, on the basis of a time duration and on the basis of the protection profile.

In one development, the drive unit is configured such that it turns off the electronic switch on the basis of a thermal model of the electronic switch and/or on the basis of a thermal model of the line to be protected.

In one development, the drive unit is configured such that the current through the electronic switch is calibratable and storable at the chip level or at the component level.

In one development, the drive unit is configured such that the protection profile is calibratable and storable at the chip level or at the component level.

In particular, current and/or protection profile can be stored permanently in a volatile or a nonvolatile memory.

In one development, the drive unit is configured such that the protection profile is altered during operation at the chip level or at the component level.

By way of example, it is possible to alter the stored values.

In one option, in particular, the calibration and/or a setting of the protection profile, e.g. of the characteristic curve (in particular of the fuse characteristic line), is carried out beforehand during the manufacture of the apparatus or in the context of an application scenario (e.g. by a customer who uses the apparatus e.g. in a vehicle).

In one development, the memory is programmable via at least one terminal pin of the apparatus.

By way of example, the protection profile (e.g. fuse characteristic curve) can be written to the memory and a protection profile present there can be changed by specific pulses or static signals being applied to at least one terminal pin of the apparatus.

One option consists in providing a maximum fuse characteristic curve which predefines the maximum permissible current depending on the exposure time. In this case, a programming of the fuse characteristic curve can only be decreased (not increased) to a lower permissible current. This corresponds to a self-protection of the apparatus.

In one development, a voltage supply is provided which supplies the apparatus with voltage on the basis of the voltages dropped between the terminals of the apparatus.

By way of example, the voltage dropped between the gate terminal and the source terminal and/or the voltage dropped between the drain terminal and the source terminal can be used for supplying the apparatus with voltage. In this case, it is advantageous that no additional supply terminal is required for the apparatus.

Alternatively, the voltage between drain (Vbat) and ground or a separate voltage source or voltage supply can be used.

One advantage also consists in the fact that with the aid of the apparatus, line protection is also possible in a standby mode in which the apparatus has a very low intrinsic current consumption.

A further advantage consists in the fact that with the aid of the apparatus, line protection is also possible in a switching mode in which the apparatus can also detect the current during the switch-on and switch-off process.

In one development, the drive unit is configured such that the electronic switch remains switched off permanently or for a necessary time duration after the protective turn-off.

In particular, a counter can be provided which counts (stores) the turn-off processes (events that led to the triggering of the fuse function). If the counter reaches a predefined threshold value, then the electronic switch can be/remain switched off permanently or signal early the imminent turn-off. Optionally, a predefined time duration can be determined, after the elapsing of which the electronic switch is switched on or can be switched on again. Said time duration can also be calculated by means of a thermal model (cooling curve of the switch or of the line).

A turn-off of the electronic switch can be realized by the apparatus such that the gate terminal of the electronic switch is connected to the source terminal. The drive unit can thus drive a switch in such a way that either the gate terminal of the apparatus is connected to the gate terminal of the electronic switch (in normal operation), or that the gate terminal of the apparatus is not connected to the gate terminal of the electronic switch (in the turned-off state).

In one development, the drive unit is configured such that the electronic switch remains switched off permanently as soon as a predefined number of turn-offs is reached or exceeded.

A further option consists in a diagnosis function of the apparatus being provided by means of a current evaluation at a terminal pin (the gate terminal) of the apparatus.

It should be noted here that the apparatus can have both n-channel MOSFETs and p-channel MOSFETs.

In one development, the electronic switch has two MOSFETs connected back-to-back.

In one development, the two MOSFETs connected back-to-back are connected via a fuse device.

In one development, the apparatus has three terminal pins and can be used instead of a conventional electronic switch.

The explanations and features described here concerning the apparatus correspondingly apply to the method. The apparatus can be embodied in one component or in a distributed manner in a plurality of components.

Furthermore, a method is proposed for driving an electronic switch,
wherein a current through the electronic switch is determined,
wherein the electronic switch is driven on the basis of the current and on the basis of a protection profile stored in a memory.

In one development,
a temperature is determined,
the electronic switch is driven on the basis of the current, the temperature and the protection profile.

In one development, the protection profile is alterable in the memory.

In one development, the protection profile is altered by the following steps being carried out:
impressing a current or a current profile into the electronic switch;
determining a turn-off time on the basis of the impressed current determining a deviation between the turn-off time and a predefined turn-off time;

readjusting the protection profile taking account of the deviation.

In one development, the steps for altering the protection profile are carried out for predefined currents and/or temperatures.

The electronic switch mentioned here can comprise in this case a transistor, bipolar transistor, field effect transistor, MOSFET, IGBT or other semiconductor switch or a combination of semiconductor switches and in the form of semiconductor modules.

BRIEF DESCRIPTION OF THE DRAWINGS

The above-described properties, features and advantages of this invention and the way in which they are achieved will become clearer and more clearly understood in association with the following schematic description of exemplary embodiments which are explained in greater detail in association with the drawings. In this case, identical or identically acting elements may be provided with identical reference signs for the sake of clarity.

FIG. 12 shows an exemplary symbolic circuit diagram for the apparatus with fuse function proposed here, comprising an n-channel MOSFET and a p-channel MOSFET, respectively; and FIG. 13 shows an apparatus for providing a bidirectional fuse function.

DETAILED DESCRIPTION OF ILLUSTRATIVE EMBODIMENTS

One objective of an electronic fuse is to protect lines connected downstream of the fuse up to a load. In particular, one aim is to use a safe operating area (SOA) of the line as efficiently as possible, that is to say to utilize the physical possibilities of the line; an efficient electronic fuse can be adapted to the line, such that the line itself no longer need be overdimensioned, or need only be overdimensioned to a reduced extent. In other words, an efficient fuse function makes it possible that the line can have a smaller cross section than would be the case with the use of a conventional fusible link. This leads to lower cable costs, lower weight and reduced space requirement (e.g. in the case of wiring harnesses in a vehicle).

Figure 1:
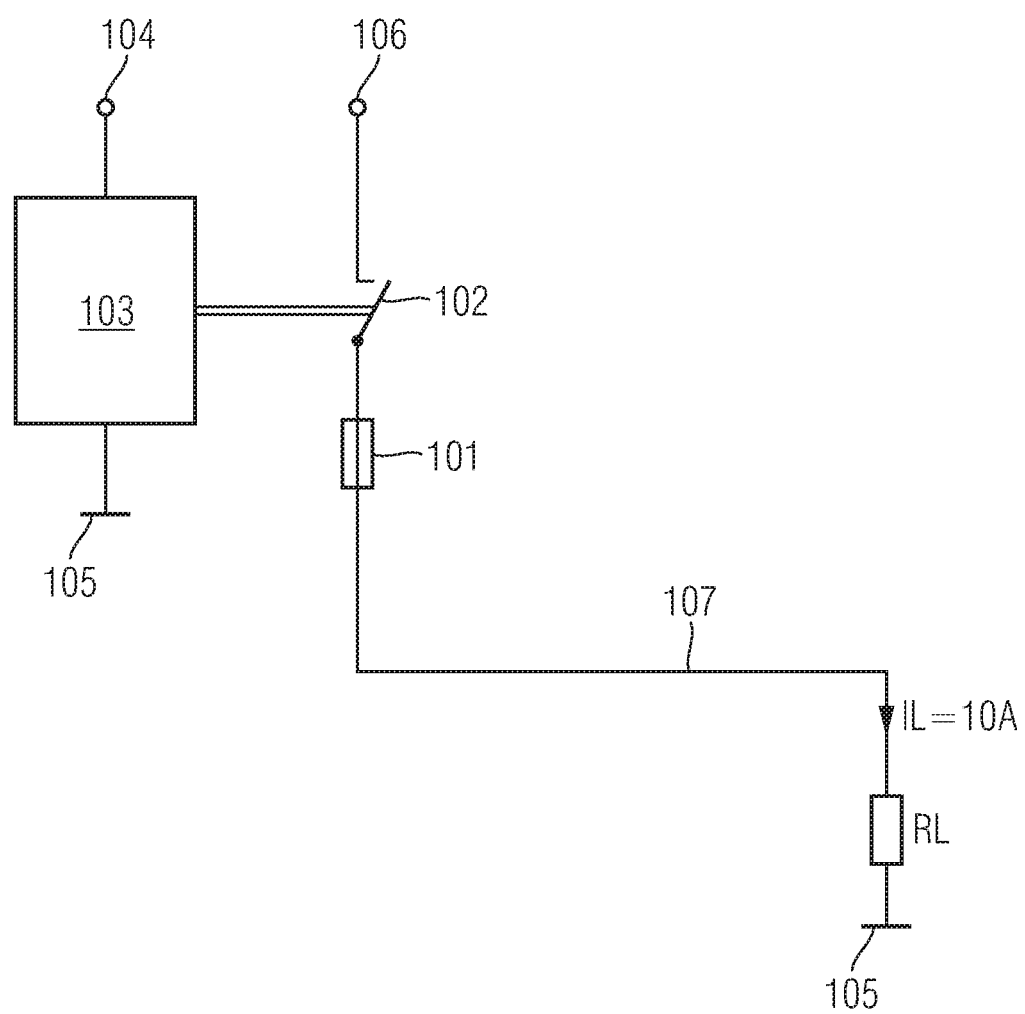
FIG. 1 shows an arrangement of a fusible link with 15 A, for example, in combination with a relay contact as a switching element in conjunction with a driving system.

FIG. 1 shows an arrangement of a fusible link 101 with 15 A, for example, in combination with a relay contact 102 as a switching element with a driving system 103. The driving system 103 can have e.g. a microcontroller and a driver and can be connected to a supply voltage 104 and to ground 105.

A battery voltage is connected to a terminal 106. The terminal 106 is connected to ground 105 via the relay contact 102, the fusible link 101, a line 107 and a load RL.

The fuse triggering of the fusible link 101 is a function of a load current IL, an exposure time t and a start temperature T and is thus independent of the relay switch function and the driving thereof. In this case, the fusible link 101 has the advantage that it triggers if the current is too high for a specific time, independently of boundary conditions such as operating voltage, switch driving or diagnosis. The fusible link is thus "self-secure".

Figure 2:
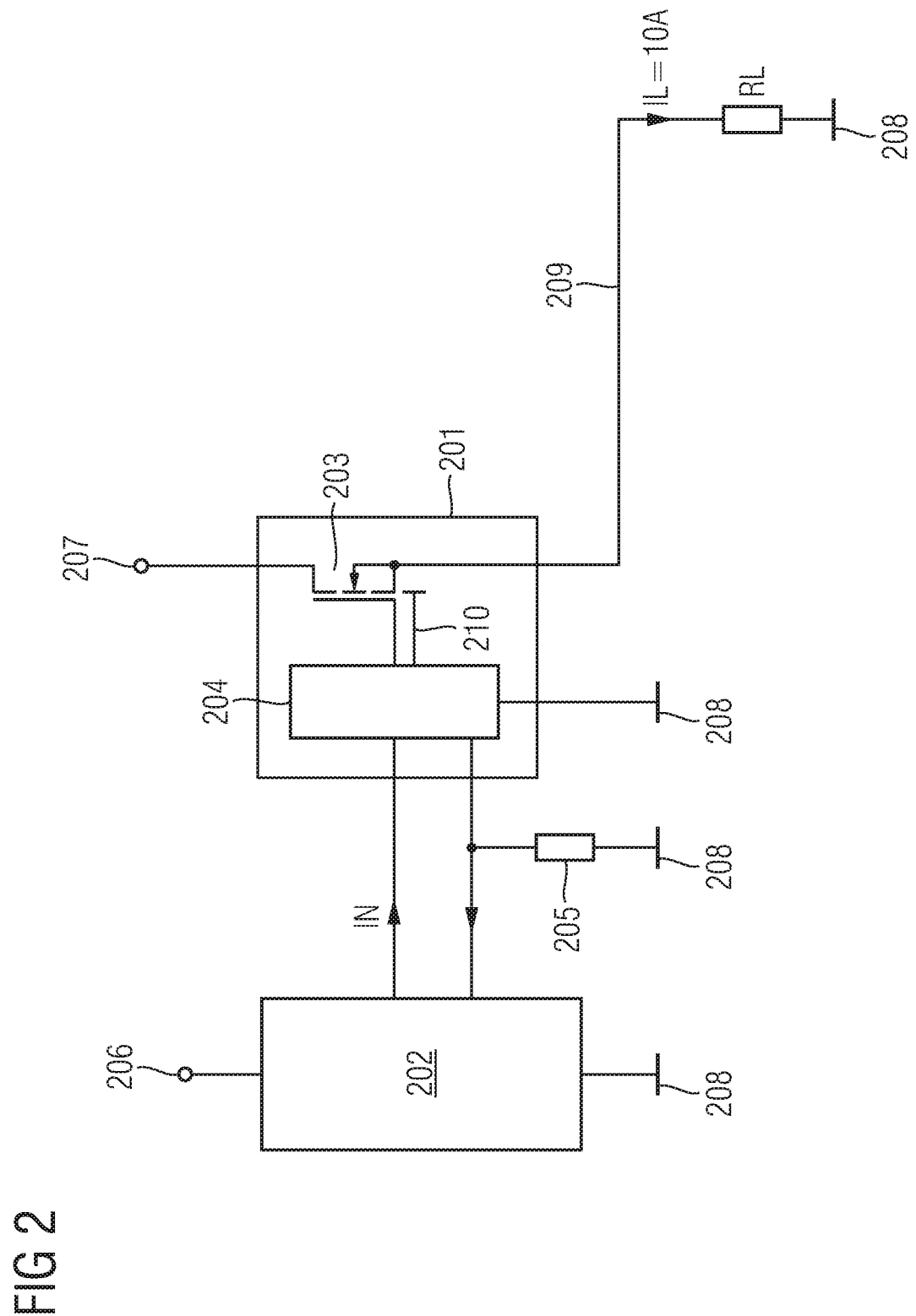
FIG. 2 shows line protection using a so-called protected electronic switch (SmartFET)

FIG. 2 shows a line protection using a so-called protected electronic switch 201, which here is also designated as SmartFET. The electronic switch 201 can comprise e.g. a semiconductor switch 203 (e.g. a transistor, a FET, a MOSFET or an IGBT) and a logic unit 204. The semiconductor switch 203 (here an n-channel MOSFET) comprises a measurement terminal 210, which, just like the gate of said switch, is connected to the logic unit 204. The logic unit 204 is furthermore connected to ground 208. A microcontroller 202 is connected to a supply voltage 206 and to ground 208. The logic unit 204 supplies a sense current to the microcontroller 202 (in accordance with a voltage dropped at a resistance 205) and the microcontroller 202 supplies a control signal IN to the logic unit 204. The drain terminal of the semiconductor switch 203 is connected to a node 207 at which a battery voltage is present. The source terminal of the semiconductor switch 203 is connected to ground 208 via a line 209 and a load RL.

A protection turn-off of the electronic switch 201 can be achieved e.g. if one of the following conditions occurs:

an exceedance of a trip current Itrip evaluated in the electronic switch 201;

an exceedance of a limiting current Ilim (e.g. limitation to 100 A), with an associated temperature increase;

an exceedance of an integrated turn-off temperature Toff (e.g. 170° C.);

an exceedance of a threshold value by a current which is determined by means of a sense current evaluation;

an exceedance of a threshold value by a current which is determined by means of a sense current evaluation, for a specific time;

a turn-off caused by the microcontroller 202.

The complete fuse function thus functions in the overall system. If, for example, the microcontroller 202 is in a sleep mode, has become stuck during processing or is utilized to capacity with other tasks, delays of the current evaluation occur. This can be problematic for a fast implementation of the fuse function. Furthermore, an erroneous measurement of the sense current or an erroneous evaluation in the microcontroller 202 can lead to a failure of the fuse function. Accordingly, the self-security of such an electronic switch is in need of improvement.

Figure 3:
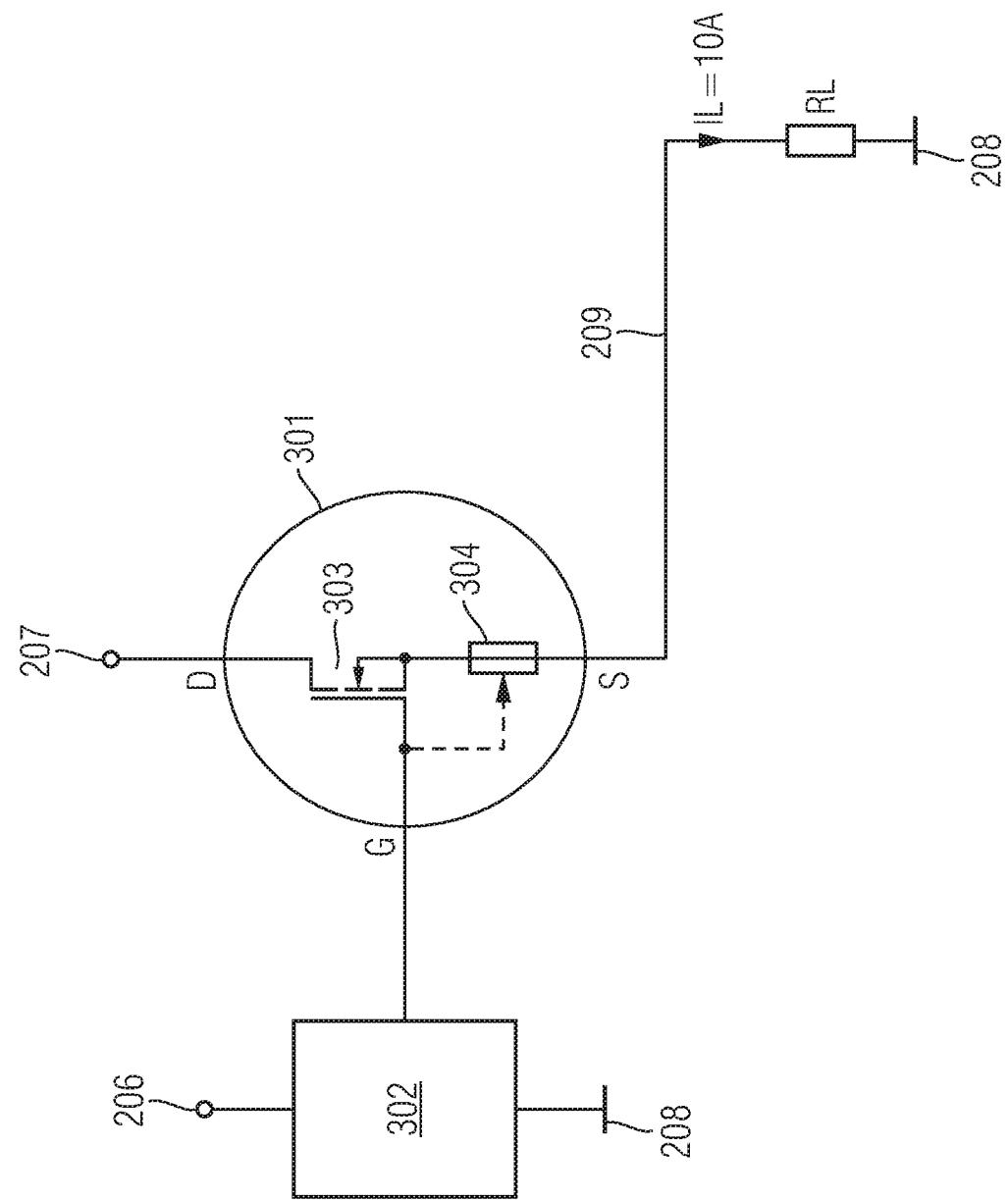
FIG. 3 shows an apparatus which provides improved self-protection.

FIG. 3 shows an apparatus 301 that provides an improved self-security. The apparatus 301 comprises an electronic switch 303, e.g. an n-channel MOSFET. The fuse functionality provided is combined with the function of the MOSFET 303, such that a self-protection is ensured even without external driving or without the evaluation of a diagnosis.

By way of example, the apparatus 301 has three terminals, which can correspond to those of a conventional transistor, e.g. MOSFET. In accordance with the example shown in FIG. 3, the apparatus 301 has the terminals gate G, source S and drain D. Furthermore, an integrated fuse function is provided, which is dependent on a load current IL and a time t. A possibly undesired dependence on a start temperature T can be reduced or eliminated. It is also an advantage that the apparatus 301 can be embodied as an integrated fuse which can be reset e.g. via its gate terminal G.

The drain terminal D is connected to a battery voltage Vbat. The source terminal is connected to a load RL via a line 209.

In this case, it is advantageous that the fuse function protects the apparatus 301 itself and also the line 209. The apparatus 301 thus provides in particular an actively protecting switch. Optionally, the fuse function can be supplemented by temperature protection, e.g. in the form of an overtemperature turn-off. The fuse functionality can comprise the function of a fusible link 304, which can be driven, e.g. reset or programmed, via the gate terminal G.

A microcontroller 302 (if appropriate with a driver that can also be part of the microcontroller) drives the gate terminal G of the apparatus 301. The microcontroller 302 is connected to a supply voltage 206 and to ground 208.

By way of example, the apparatus 301 has a nominal current of 10 A and an implemented fuse at a rated current Is of 15 A. The current Is can be impressed in the apparatus 301 e.g. from the factory. In one option, moreover, the current Is can be programmed later, e.g. for an application, to a predefined, e.g. lower, value.

By way of example, the fuse function of the apparatus 301 has the characteristic curve of a fusible link. For this purpose, e.g. by means of a logic part (in the apparatus 301 or in the microcontroller 302) a product $$IL^2 \cdot t,$$

of the square of the load current and time t can be integrated over the exposure time t. If the result of this integration exceeds a predefined limit value, then the apparatus 301 is turned off.

The characteristic curve can also be configured in a manner deviating from a fusible link. In particular, the characteristic curve could be configured or configurable toward individual stipulations. By way of example, the characteristic curve is designed for an SOA characteristic curve (SOA: Safe Operating Area) of the line to be protected, e.g. for a line having a copper cross section of 1 mm², which is situated in surrounding air at max. 85° C. and the insulation of which is permitted to be heated to max. 105° C. If a different line is used, having a maximum insulator temperature of 150° C., for example, or if the line is situated for example in surroundings at 105° C., then this results in a different SOA characteristic curve of the line. The individual stipulation of the characteristic curve in the apparatus 301 is preferably designed such that different conditions can be taken into account.

Figure 4:
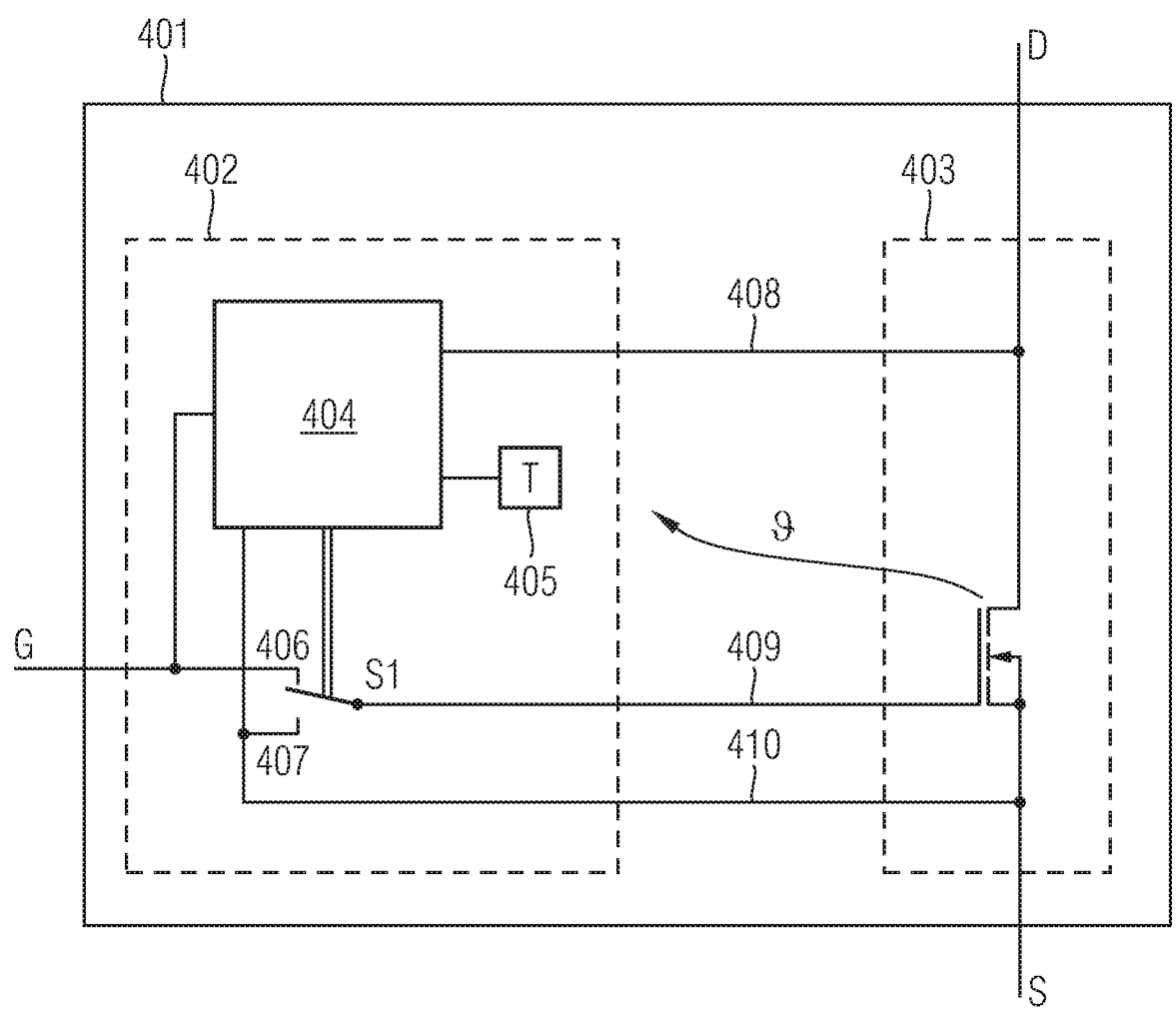
FIG. 4 shows a schematic diagram of a circuit for an exemplary realization of an apparatus with fuse function.

FIG. 4 shows a schematic diagram of a circuit for an exemplary realization of an apparatus 401 with fuse function.

By way of example, the apparatus can comprise an n-channel MOSFET 403 and a control circuit 402, which can be arranged in particular in a common housing. Moreover, the semiconductor elements (chips) can be constructed using a chip-on-chip technique or using a chip-by-chip technique. In one advantageous embodiment, the apparatus has the three terminals gate G, source S and drain D and can thus be used instead of a conventional MOSFET. The drain terminal of the apparatus 401 corresponds to the drain terminal of the MOSFET 403, and the source terminal of the apparatus 401 corresponds to the source terminal of the MOSFET 403.

The control circuit 402 comprises a unit 404 which provides a current supply, a logic circuit and a memory. Furthermore, the control circuit 402 comprises a switch Si and a temperature sensor 405.

By means of the temperature sensor 405, a temperature of the MOSFET 403 can be determined sufficiently accurately and be communicated to the unit 404.

The gate terminal of the apparatus 401 is connected to the unit 404 and to a terminal 406 of the switch Si. A terminal 407 of the switch Si is connected to the unit 404 and to the source terminal of the MOSFET 403. The switch Si is driven by the unit 404 such that either the terminal 406 or the terminal 407 is connected to the gate terminal of the MOSFET 403. Furthermore, the unit 404 is connected to the drain terminal of the MOSFET 403.

As a result, there are thus the connections 408, 409 and 410 between the control circuit 402 and the MOSFET 403.

In this case, it is advantageous that a conventional inexpensive MOSFET chip can be used as MOSFET 403. Said MOSFET 403 itself does not require a measurement or temperature terminal.

A load current is determined on the basis of a voltage UDS dropped between the drain terminal and the source terminal of the MOSFET 403. The voltage UDS is usually greatly temperature-dependent on account of the temperature dependence of the on resistance RON of the MOSFET 403. This temperature dependence of the on resistance RON can (e.g. approximately) be stored in the memory of the unit 404 and thus become compensated for. Further temperature dependencies, variations or deviations from the ideal behavior, e.g. on the basis of manufacturing and assembly variations, can be calibrated by means of a reference measurement and can optionally also be stored in the memory of the unit 404. The memory is a permanent memory, for example.

For the (largely) temperature-independent load current $IL_0$ it holds true that $$IL_0 = \frac{UDS(T)}{RON_0(T)},$$

wherein the voltage UDS(T) and the temperature T are measured and the characteristic curve of the on resistance $RON_0(T)$ is stored in the memory.

The temperature T is determined for example by means of the temperature sensor 405 in the control circuit 402. The temperature thus measured can deviate from the temperature of the MOSFET channel, which causes a certain inaccuracy in the evaluation of the load current IL. This inaccuracy can be reduced or compensated for by extrapolating to the actual temperature proceeding from the measured temperature by means of knowledge of current and time. Such an extrapolation can be carried out for example within the control circuit 402 by means of a thermal model of the MOSFET 403. The accuracy of the determination of the load current IL can be improved further as a result.

Figure 5:
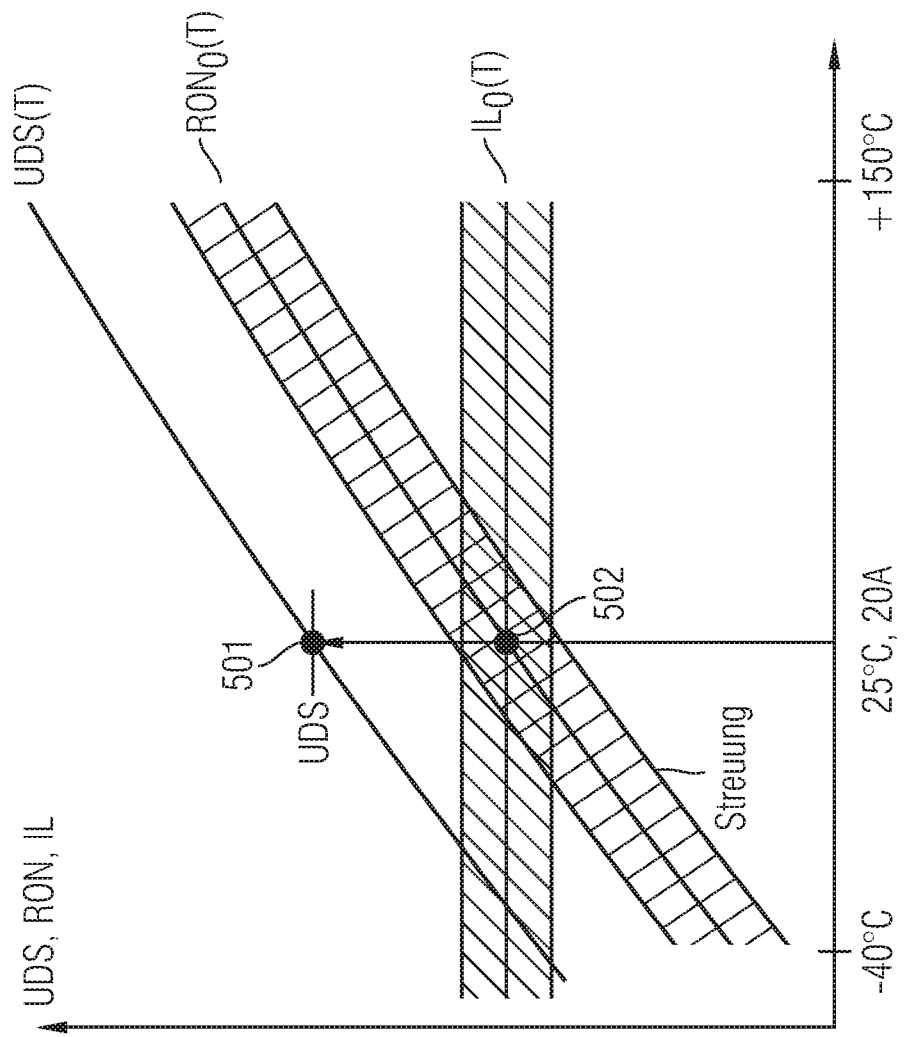
FIG. 5 shows an exemplary diagram for illustrating the measurement of the load current IL by means of the evaluation of the voltage UDS.

FIG. 5 shows an exemplary diagram for illustrating the measurement of the load current IL by means of the evaluation of the voltage UDS.

A temperature range of −40° C. to 150° C., for example, is plotted on the x-axis. The following are illustrated over this temperature range:
- a (measured) characteristic curve of the voltage UDS, which is dependent on the temperature T and on the on resistance RON,
- a characteristic curve of the on resistance $RON_0$ corresponding to the physical stipulations with a production-dictated variation (identified by a region around the characteristic curve),
- a characteristic curve of a load current $IL_0$ in accordance with the calibration and calculation (it is evident here that the load current $IL_0$ is temperature-independent and in accordance with the variation of the on resistance $RON_0$ has a certain variation that is largely eliminated, e.g. by the calibration).

If an actual load current of 20 A is impressed in a calibration process at a temperature of 25° C., for example, a measured voltage UDS 501 results therefrom. From this it is possible to determine a measurement value 502 for the load current IL which corresponds exactly to the load current of 20 A.

A supply voltage Vint for the control circuit 402 can be attained from the voltage UDS or from a voltage UGS (voltage between the gate terminal and the source terminal of the MOSFET 403). Within the apparatus 401 the gate terminal G and the connections 408 and 410 can be used for this purpose. If the MOSFET 403 is used as a switching transistor, one of the two voltages UDS or UGS is always available with a sufficient magnitude. A continuous supply of the control circuit 402 is thus ensured, without this necessitating an additional terminal for the supply voltage.

Figure 6:
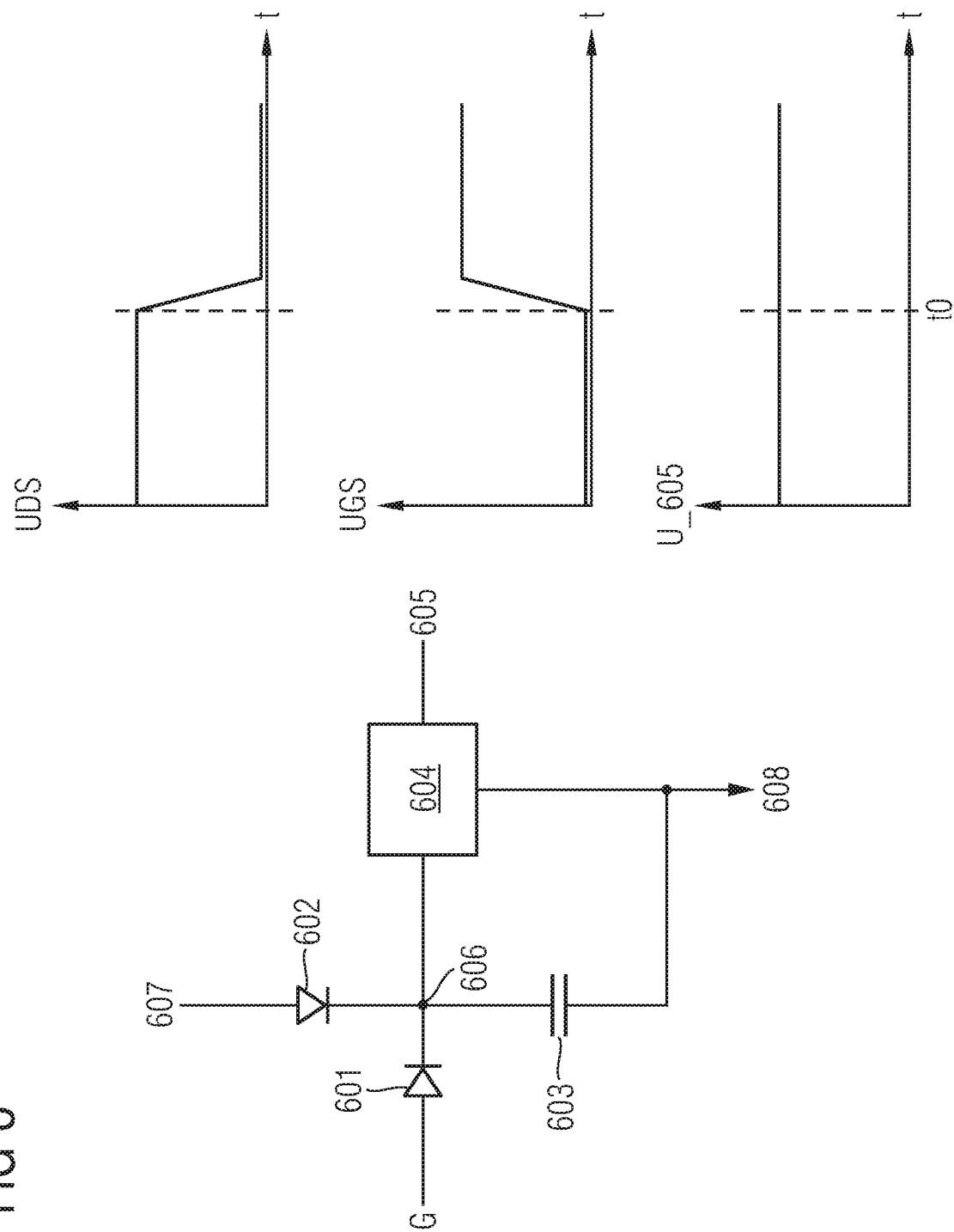
FIG. 6 shows an exemplary diagram for a voltage supply of the control circuit.

FIG. 6 shows an exemplary diagram for a voltage supply of the control circuit 402. The gate terminal G is connected to a node 606 via a diode 601. The node 606 is connected via a voltage regulator 604 to a node 605 at which the supply voltage Vint for the control circuit 402 is provided. The node 606 is connected via a diode 602 to a terminal 607 that is contacted with the connection 408. The diode 601 and the diode 602 are arranged such that the cathode thereof in each case faces in the direction of the node 606.

The node 606 is furthermore connected via a capacitor 603 to a terminal 608 that is contacted with the connection 410. The terminal 608 is also connected to the voltage regulator 604.

By means of the circuit shown in FIG. 6 it is possible to provide a continuous supply voltage at the node 605. If the voltage UDS turns off at a time to, then the voltage UGS rises at said time to; the supply voltage for the operation of the control circuit 402 can be obtained overall from the two voltages.

As soon as the control circuit 402 has determined the condition for the fuse triggering, the gate terminal G is disconnected from the connection 409 to the gate of the MOSFET 403 and, via the connection 410, the potential at the source terminal of the MOSFET 403 is intended to be linked to the potential of the gate of the MOSFET 403. This relationship is illustrated by the switch Si in FIG. 4.

Figure 7:
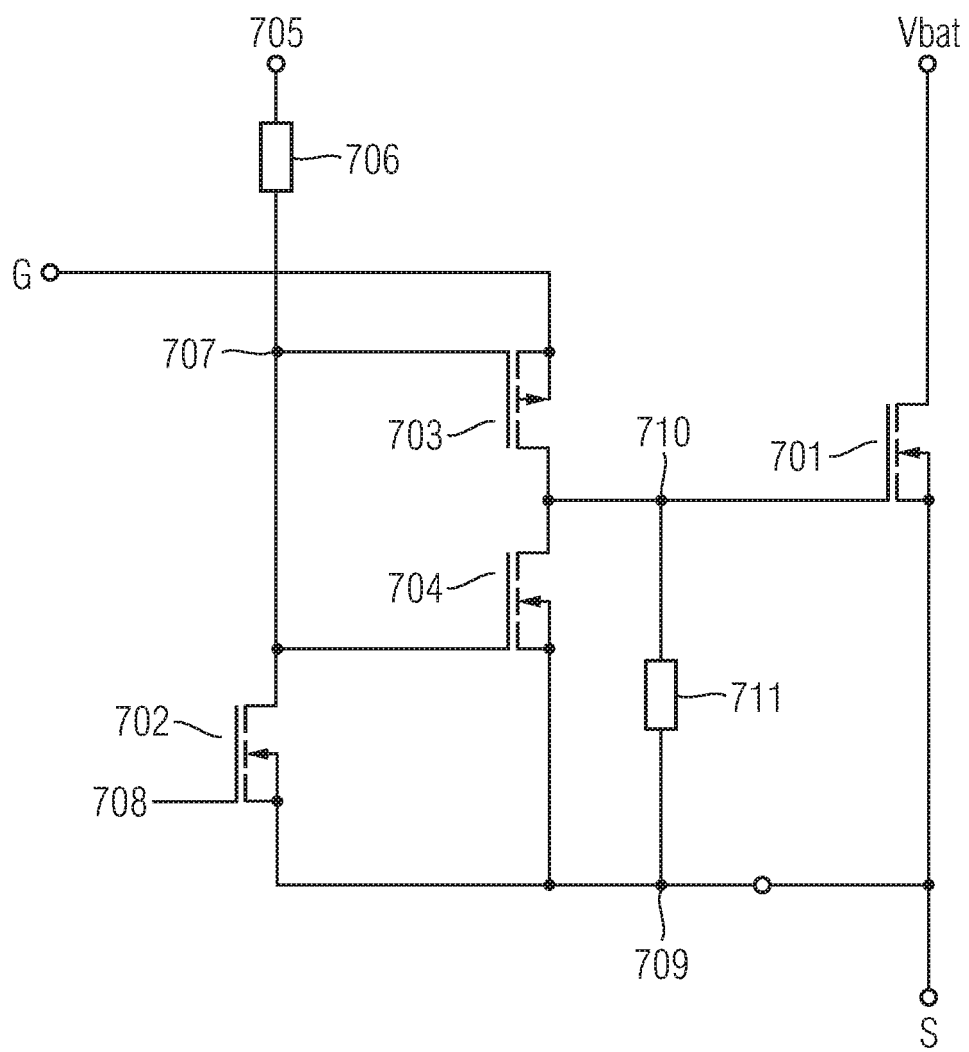
FIG. 7 shows an exemplary circuit arrangement for a gate driving system by means of a plurality of transistors.

FIG. 7 shows an exemplary circuit arrangement for such a gate driving system by means of a plurality of transistors 701 to 704, wherein the transistors 701, 702 and 704 are re-channel MOSFETs and the transistor 703 is a p-channel MOSFET.

The gate terminal G is connected to the source terminal of the MOSFET 703. The supply voltage is present at a terminal 705 that is connected to a node 707 via a resistor 706. The node 707 is connected to the gate terminal of the MOSFET 703 and to the gate terminal of the MOSFET 704. Furthermore, the node 707 is connected to the drain terminal of the MOSFET 702.

A terminal 708 is connected to the unit 404 and to the gate terminal of the MOSFET 702. The source terminal of the MOSFET 702 is connected to a node 709 that is also connected to the source terminal of the MOSFET 704 and to the source terminal of the MOSFET 701. The MOSFET 701 here corresponds to the controlled electronic switch 403 from FIG. 4.

The drain terminal of the MOSFET 703 is connected to a node 710 and to the drain terminal of the MOSFET 704. The node 710 is connected to the gate terminal of the MOSFET 701. Furthermore, a resistor 711 is arranged between the node 710 and the node 709.

The drain terminal of the MOSFET 701 is connected to a battery voltage Vbat.

By way of example, the voltage drop UDS between the drain terminal and the source terminal of the MOSFET 701 can be measured by means of a comparator and be communicated to the unit 404, which then correspondingly drives the gate terminal of the MOSFET 702.

The unit 404 can be configured in such a way that after the triggering of the fuse function, the apparatus obtains either a function LATCH-OFF or a function AUTO-RESTART. In the case of the function LATCH-OFF, the MOSFET 701 can remain switched off permanently. The LATCH-OFF function can be reset by means of the momentary deactivation of the gate voltage UGS (0V). In the function AUTO-RESTART, the fuse function can be reset via the MOSFET 701 (e.g. automatically) after a predefined time duration or a simulated cooling phase of the line.

One option consists in the fuse function not being reset upon every pulse gap of a pulse width modulation application. This can be achieved e.g. by a time duration until the resetting of the fuse function being greater than the longest time duration for which a PWM signal (PWM: pulse width modulation) is switched off.

Another option consists in the MOSFET 701 being turned on even if no (or no significant) load current flows. This applies for example to a vehicle which has only a low intrinsic current consumption in a parked or other current saving mode (also designated as IDLE mode). The line protection is intended to function even in the IDLE mode. The apparatus 401 described here makes this possible since the measurement of the voltage UDS at the MOSFET 701 is possible even with a low load current. In particular, it is possible to detect the voltage UDS and the magnitude of the load current IL to be determined therefrom with a very low intrinsic current consumption in the apparatus 401 since this does not necessitate large current consumers such as current mirrors, for example, as would be necessary in the case of a sense current measurement.

The data for calibrating the load current and for setting the fuse characteristic curve are stored for example in a memory, e.g. an EEPROM, flash, OTP or ZAP memory.

During the production of the apparatus, the memory can be programmed e.g. via terminals, pads or wafer needles. During production and/or during use (e.g. by the customer), the memory can be programmed at a test instrument via existing terminal pins.

Figure 8:
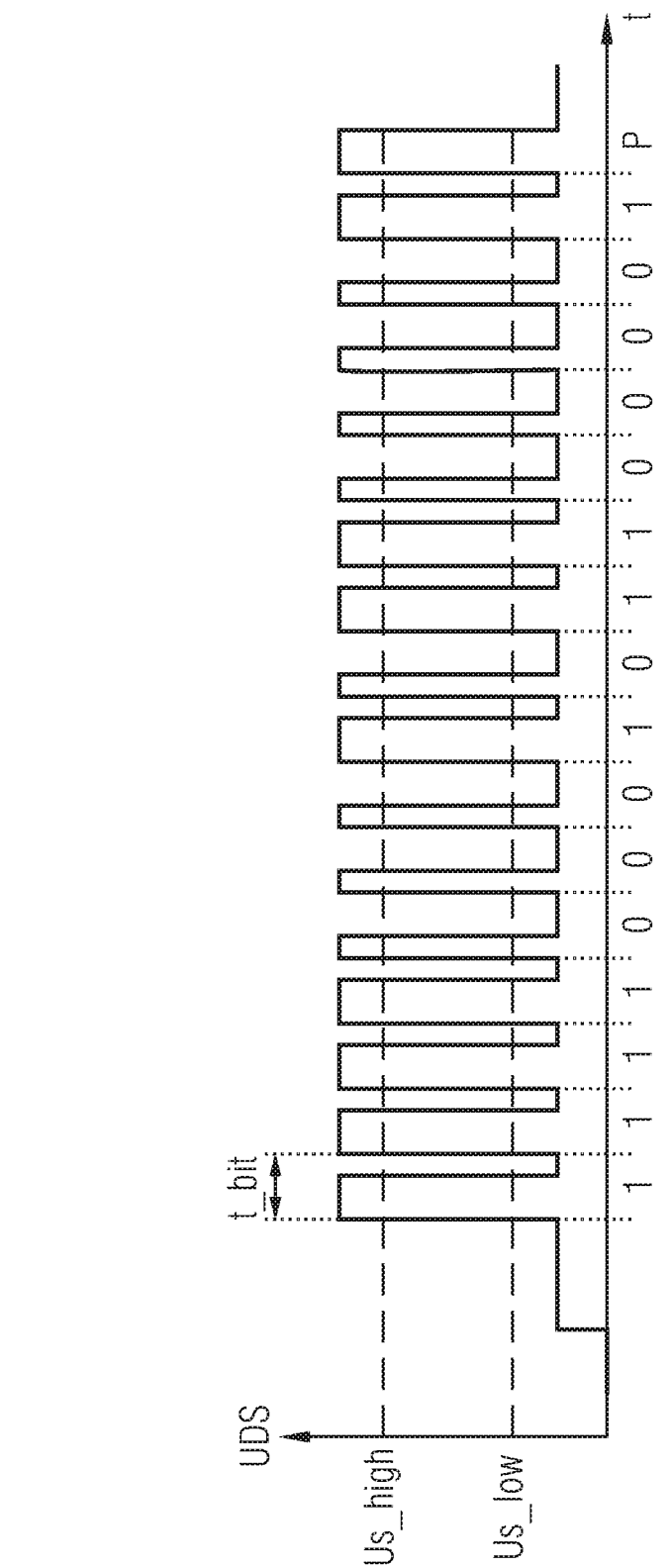
FIG. 8 shows an exemplary diagram with a voltage sequence for enabling programming of the unit.

FIG. 8 shows an exemplary diagram with a voltage sequence for enabling programming of the unit 404. By way of example, the drain-source voltage UDS of the MOSFET 701 can be modulated in accordance with a predefined pattern in order to arrive at a programming mode of the unit 404. In the programming mode, a modulation scheme can be used to program the unit 404, and the gate terminal serves as data input and is embodied separately from the MOSFET 701. One option consists in the fact that after programming, the gate terminal of the MOSFET 701 is released and used for outputting the memory content in order to verify the latter.

FIG. 8 shows a programming of a plurality of bits, wherein a bit is programmed with the value "0" or "1" during a duration t_bit. In the example shown, the value "1" is programmed if, during the duration t_bit, firstly a voltage greater than Us_high is present for a longer duration and then a voltage less than Us_low is present for a shorter duration. Conversely, the value "o" is programmed if, during the duration t_bit, firstly a voltage greater than Us_high is present for a shorter duration and then a voltage less than Us_low is present for a longer duration. The shorter duration can be t_bit/3 and the longer duration can be 2*t_bit/3. If the voltage less than Us_low is maintained for a longer time duration (e.g. longer than 2*t_bit/3), then the programming mode is left again. Correspondingly, the programming mode can be initiated with the same signal.

Before each protection turn-off, the semiconductor switch is subjected to a considerable thermal loading. A multiplicity of protection turn-offs thus reduce the lifetime of the semiconductor switch. One option thus consists in predefining a maximum number of fuse triggerings, which is monitored for example by the unit 404 (e.g. a "State Machine"). Upon said number being reached, the apparatus can be turned off permanently (i.e. the MOSFET 403 is turned off) or the MOSFET 403 (note: this also applies to the MOSFET 701 from FIG. 7) is permitted to undergo only a predefined number of further switch-on processes. This has the advantage that the semiconductor switch is protected and can be turned off (also permanently) in good time before a potential aging defect occurs.

The number of protection turn-offs can be stored in the memory, for example. Upon a predefined number of protection turn-offs being reached (optionally: per predefined time period), the process of switching the semiconductor switch on again can be blocked.

The unit 404 (or the control circuit 402) of the apparatus 401 as explained here by way of example can be supplemented by further functions and/or components.

Figure 9:
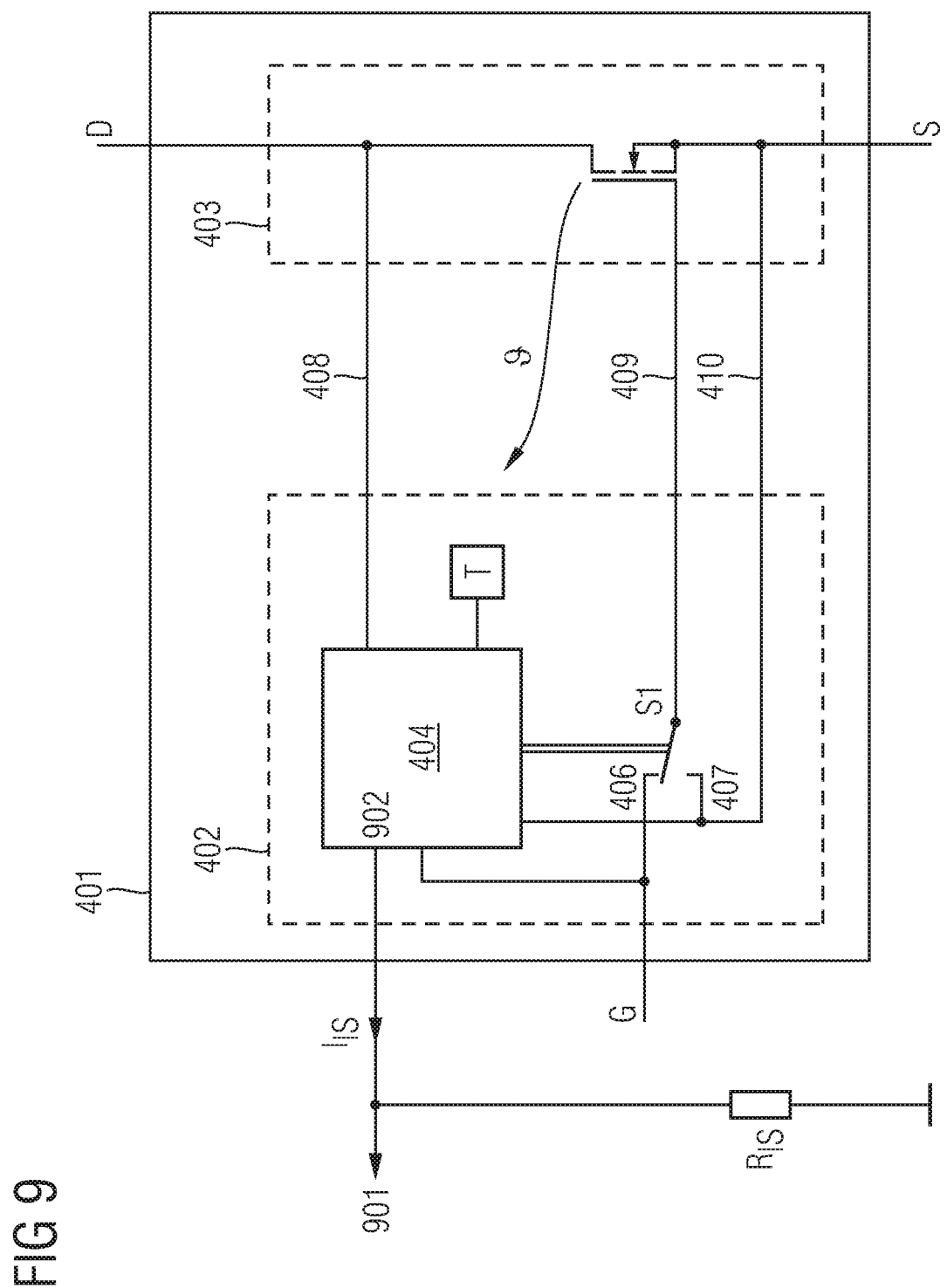
FIG. 9 shows a circuit based on the illustration in FIG. 4, a measurement current being provided.

FIG. 9 shows a circuit based on the illustration in FIG. 4. The unit 404 can provide current information at a terminal 901, wherein for this purpose a current $I_{IS}$ is output for example at a terminal 902 of the unit 404, said current being converted by means of a resistance $R_{IS}$ into a voltage proportional thereto $$U_{IS}=R_{IS}\cdot I_{IS}$$

At the resistance $R_{IS}$ it is thus possible to generate a proportional voltage drop with ground reference for a microcontroller.

Figure 10:
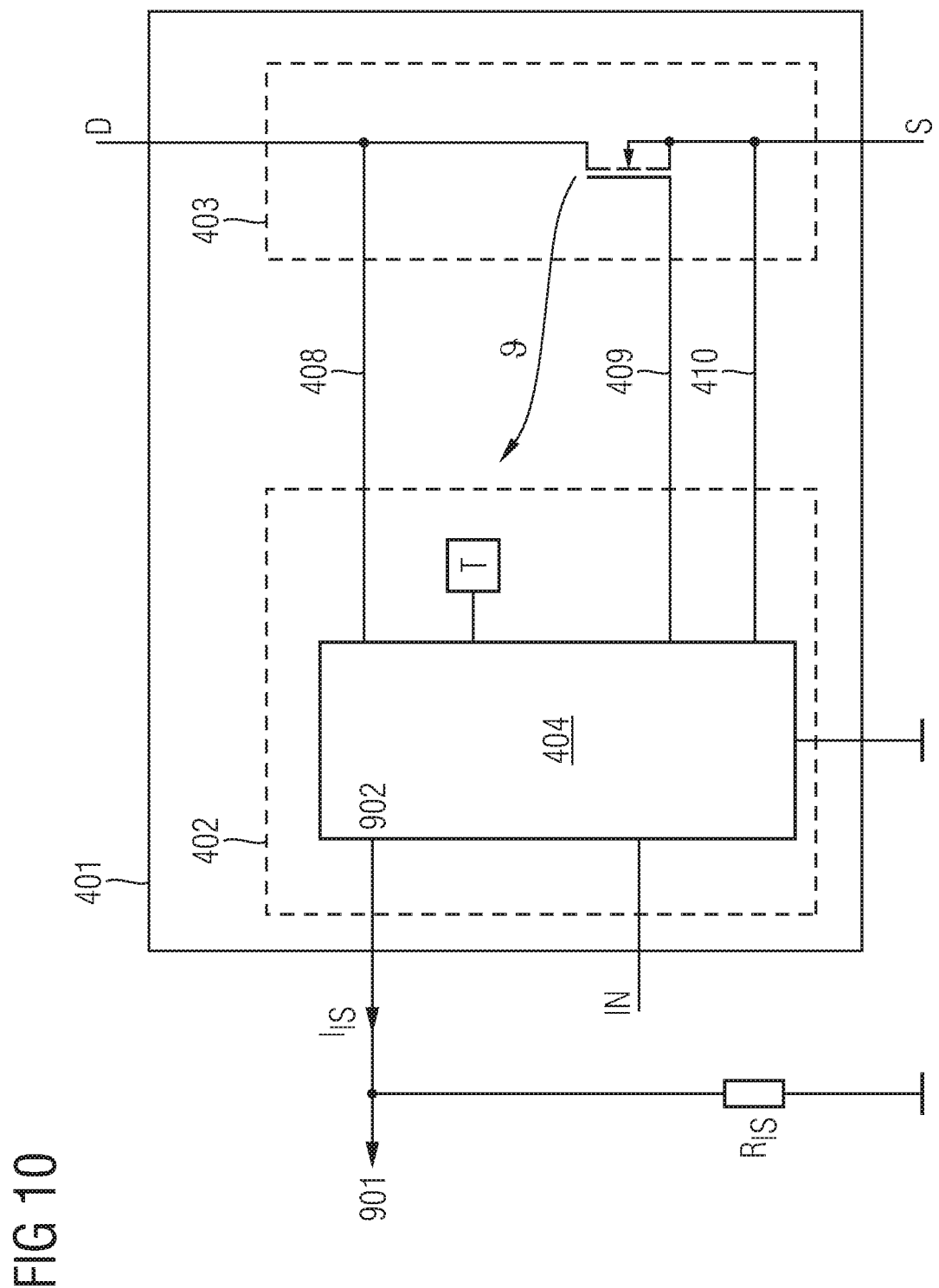
FIG. 10 shows a schematic circuit diagram for an alternative embodiment in which the gate terminal of the MOSFET is driven via a charge pump.

FIG. 10 shows a schematic circuit diagram for an alternative embodiment, in which the unit 404 has a gate charge pump in order to drive the gate terminal of the MOSFET 403.

The circuit shown in FIG. 10 is based on the circuit in accordance with FIG. 9. In contrast to FIG. 9, a switch Si via which the gate terminal of the MOSFET 403 can be driven directly is not provided. Instead, the unit 404 in FIG. 10 comprises a digital input pin IN, which switches on and off a charge pump integrated in the unit 404. The input pin IN is ground-referenced; the unit 404 preferably likewise has a ground terminal. The voltage supply of the unit 404 is effected via the drain terminal of the MOSFET 403 (Vbat) and the ground terminal. Alternatively, the unit 404 can also have a dedicated positive supply terminal with a dedicated supply voltage.

By means of the charge pump in the unit 404, the gate voltage for the MOSFET 403 is provided at the connection 409.

Figure 11:
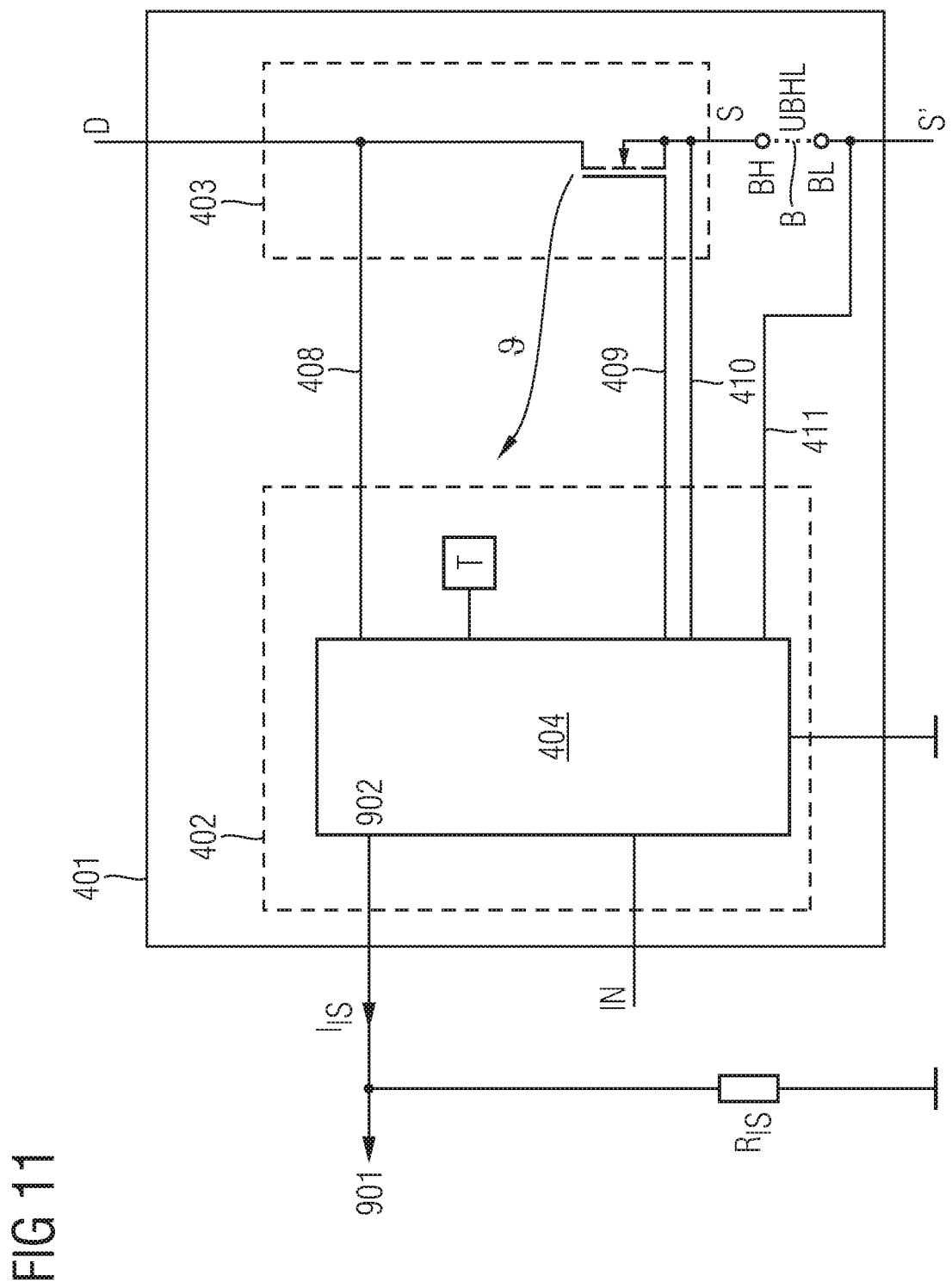
FIG. 11 shows a further schematic circuit diagram based on the circuit shown in FIG. 10, wherein a voltage drop across a bonding wire is determined and the MOSFET is driven depending on said voltage drop.

Figure ii shows a further schematic circuit diagram based on the circuit shown in FIG. 10. In contrast to FIG. 10, the circuit in accordance with FIG. 11 has a bonding wire B, which connects a node BH to a node BL. The node BH is connected to the connection 410 and to the source terminal of the MOSFET 403. The node BL is connected to the unit 404 via a connection 411. Furthermore, the node BL is connected to a terminal S' of the apparatus 401.

In this case, it should be noted that a ribbon bond, clip bond or some other type of bond affected by resistance can also be used instead of the bonding wire. In one option, moreover, a voltage drop to be evaluated can also be tapped off at housing parts affected by resistance or other components affected by resistance.

In this example, the load current IL is not detected by means of the voltage UDS at the MOSFET 403, but rather by means of a voltage drop UBHL at the bonding wire B. Here, too, a voltage measurement for determining the load current is involved; the abovementioned steps of evaluation and calibration can thus be applied accordingly. Since the bonding wire B is also a temperature-dependent resistance, for the bonding wire B, too, it is possible to provide a temperature- and variation-dependent characteristic curve in the memory of the unit 404.

One advantage is that the load current can also be determined linearly during the switch-on and switch-off process from the MOSFET 403 and the complete fuse function is thus already available during the switching process.

A defect of a continuously conducting MOSFET 403 can be identified in the switched-off state of the MOSFET 403 since a current flow is already measured, even though the latter should be zero.

The advantage of using a conventional MOSFET chip is maintained here: in particular, it is not necessary to integrate measuring structures into the semiconductor itself. The connection 411 between the unit 404 and the MOSFET 403 enables the unit 404 to detect the voltage drop UBHL at the bonding wire B.

FIG. 12 shows an exemplary symbolic circuit diagram 905 for the apparatus with fuse function proposed here, comprising an n-channel MOSFET, and an exemplary symbolic circuit diagram 907 for the apparatus with fuse function proposed here, comprising a p-channel MOSFET.

The circuit diagrams 905 and 907 show by way of example unidirectional components on the basis of conventional MOSFETs, i.e. the fuse characteristic curve takes effect only in a main current direction. In the case of a polarity reversal of the operating voltage, the current flows in parallel with the MOSFET via an antiparallel diode 906 and 908 (also designated as "Body Diode"), respectively. Consequently, no fuse turn-off is carried out in this case of polarity reversal.

A bidirectional fuse function can be achieved by means of the apparatuses 910, 911 in accordance with FIG. 13. The apparatus 910 comprises two n-channel MOSFETs, and the apparatus 911 comprises two p-channel MOSFETs.

The bidirectional apparatus 910, 911 comprises in each case two MOSFETs connected back-to-back. For this purpose, either the drain or the source terminals can be interconnected. The interconnection of the source terminals is advantageous in order that the gate-source voltage is identical for both transistors. The following aims can be achieved with this approach:

The second transistor of the respective circuit serves as polarity-reversal protection switch. In the event of a polarity reversal, the current flow is turned off and no fuse function is required. This is advantageous because, in the event of a polarity reversal, usually no current is intended to flow (reverse blocking).

In the event of the polarity reversal and in the case of a reverse flowing current, the second transistor of the respective circuit performs the switching function and also the fuse turn-off function. It can thus both be switched in a reverse conducting fashion and ensure fuse protection in the process. Preferably, the diagnosis and calibration measures carried out for the second transistor can be the same as those carried out for the first transistor, except with a changed sign of the voltage.

Although the invention has been more specifically illustrated and described in detail by means of the at least one exemplary embodiment shown, nevertheless the invention is not restricted thereto and other variations can be derived therefrom by the person skilled in the art, without departing from the scope of protection of the invention.

What is claimed is:

1. An apparatus comprising
an electronic switch;
a drive unit for driving the electronic switch;
a diagnosis unit for determining a current through the electronic switch; and
a memory for storing a protection profile,
wherein the drive unit is configured such that the electronic switch is driven on the basis of the current through the electronic switch determined by the diagnosis unit and on the basis of the protection profile, and
wherein the electronic switch, drive unit, diagnosis unit and memory are disposed within a common housing having terminal pins electrically connected to a maximum of five nodes within the common housing,
wherein the protection profile is configured to be altered by:
impressing a first current into the electronic switch,
determining a turn-off time on the basis of the impressed first current,
determining a deviation between the turn-off time and a predefined turn-off time, and
readjusting the protection profile taking account of the deviation.

2. The apparatus as claimed in claim 1, wherein the diagnosis unit is configured for determining a temperature.

3. The apparatus as claimed in claim 2, wherein the temperature is determined by means of a temperature sensor arranged in proximity to the electronic switch.

4. The apparatus as claimed in claim 2, wherein the drive unit is configured such that the electronic switch is driven on the basis of the current through the electronic switch determined by the diagnosis unit, on the basis of the temperature and on the basis of the protection profile.

5. The apparatus as claimed in claim 2, wherein the temperature of the electronic switch is determined taking account of a thermal model of the electronic switch.

6. The apparatus as claimed in claim 2, wherein the temperature of a line to be protected is determined taking account of a thermal model of the line.

7. The apparatus as claimed in claim 2, wherein the apparatus has three terminal pins and can be used instead of a conventional electronic switch.

8. The apparatus as claimed in claim 1, wherein the protection profile corresponds to a characteristic curve or comprises at least one characteristic curve.

9. The apparatus as claimed in claim 8, wherein the characteristic curve comprises a temperature-dependent profile of a resistance RON of the electronic switch.

10. The apparatus as claimed in claim 8, wherein the characteristic curve comprises a temperature-dependent profile of a resistance of a bonding wire.

11. The apparatus as claimed in claim 1, wherein the drive unit is configured to turn off the electronic switch on the basis of the current through the electronic switch determined by the diagnosis unit, on the basis of a time duration and on the basis of the protection profile.

12. The apparatus as claimed in claim 11, wherein the drive unit is configured to turn off the electronic switch on the basis of a thermal model of the electronic switch and/or on the basis of a thermal model of a line to be protected.

13. The apparatus as claimed in claim 1, wherein the drive unit is configured to calibrate and store the current through the electronic switch at a chip level or at a component level.

14. The apparatus as claimed in claim 1, wherein the drive unit is configured to calibrate and store the protection profile at a chip level or at a component level.

15. The apparatus as claimed in claim 1, wherein the drive unit is configured to alter the protection profile during operation at a chip level or at a component level.

16. The apparatus as claimed in claim 1, wherein the memory is programmable via at least one terminal pin of the apparatus.

17. The apparatus as claimed in claim 1, comprising a voltage supply which supplies the apparatus with voltage on the basis of the voltages dropped between terminals of the apparatus.

18. The apparatus as claimed in claim 1, wherein the drive unit is configured to permanently switch off the electronic switch after a protective turn-off.

19. The apparatus as claimed in claim 1, wherein the drive unit is configured to permanently switch off the electronic switch as soon as a predefined number of turn-offs is reached or exceeded.

20. The apparatus as claimed in claim 1, wherein the electronic switch has two MOSFETs connected back-to-back.

21. The apparatus as claimed in claim 20, wherein the two MOSFETs connected back-to-back are connected via a fuse device.

22. The apparatus of claim 1, wherein:
the electronic switch comprises a MOSFET;
at least a first terminal pin of the terminal pins is electrically connected to a gate of the MOSFET;
at least a second terminal pin of the terminal pins is electrically connected to a drain of the MOSFET; and
at least a third terminal pin of the terminal pins is electrically connected to a source of the MOSFET.

23. The apparatus of claim 22, wherein at least a fourth terminal pin of the terminal pins is electrically connected to a ground node.

24. The apparatus of claim 23, wherein at least a fifth terminal pin of the terminal pins is electrically connected to a current output node configured to be coupled to an external resistor.

25. A method for driving an electronic switch, the method comprising:
  determining a current through the electronic switch using a diagnosis unit, wherein the electronic switch, a drive unit for driving the electronic switch, the diagnosis unit for determining the current through the electronic switch, and a memory for storing a protection profile are disposed in a common housing having terminal pins electrically connected to a maximum of five nodes within the common housing; and
  driving the electronic switch on the basis of the current and on the basis of the protection profile stored in the memory, wherein the protection profile is altered by the following steps being carried out:
    impressing a first current into the electronic switch,
    determining a turn-off time on the basis of the impressed first current,
    determining a deviation between the turn-off time and a predefined turn-off time, and
    readjusting the protection profile taking account of the deviation.

26. The method as claimed in claim 25, further comprising:
  determining a temperature,
  wherein the electronic switch is driven on the basis of the current, the temperature and the protection profile.

27. The method as claimed in claim 25, wherein the protection profile is alterable in the memory.

28. The method as claimed in claim 27, wherein the steps for altering the protection profile are carried out for predefined currents and/or temperatures.

29. A method for driving an electronic switch, the method comprising:
  determining a current through the electronic switch; and
  driving the electronic switch on the basis of the current and on the basis of a protection profile stored in a memory, wherein the protection profile is alterable in the memory, and wherein the protection profile is altered by the following steps being carried out:
    impressing a first current into the electronic switch,
    determining a turn-off time on the basis of the impressed first current,
    determining a deviation between the turn-off time and a predefined turn-off time, and
    readjusting the protection profile taking account of the deviation.

30. The method of claim 29, wherein the steps for altering the protection profile are carried out for predefined currents and/or temperatures.

* * * * *